(12) United States Patent  
Bell et al.

(10) Patent No.: US 9,006,556 B2  
(45) Date of Patent: Apr. 14, 2015

(54) THERMOELECTRIC POWER GENERATOR FOR VARIABLE THERMAL POWER SOURCE

(75) Inventors: Lon E. Bell, Altadena, CA (US); Douglas Todd Crane, Pasadena, CA (US)

(73) Assignee: Genthem Incorporated, Azusa, CA (US)

( * ) Notice: Subject to any disclaimer, the term of this patent is extended or adjusted under 35 U.S.C. 154(b) by 1720 days.

(21) Appl. No.: 11/476,325

(22) Filed: Jun. 28, 2006

(65) Prior Publication Data

US 2010/0236595 A1    Sep. 23, 2010

Related U.S. Application Data

(60) Provisional application No. 60/694,746, filed on Jun. 28, 2005.

(51) Int. Cl.
 *H01L 35/30* (2006.01)
 *F01P 9/06* (2006.01)
 *F01P 11/20* (2006.01)

(52) U.S. Cl.
 CPC . *H01L 35/30* (2013.01); *F01P 9/06* (2013.01); *F01P 2011/205* (2013.01); *F02G 2260/00* (2013.01); *Y02E 20/14* (2013.01)
 USPC .......... 136/205; 136/206; 136/207; 136/208; 136/209; 136/210; 136/211; 136/212

(58) Field of Classification Search
 USPC .............................. 136/205–212; 60/272–324
 See application file for complete search history.

(56) References Cited

U.S. PATENT DOCUMENTS

| | | | |
|---|---|---|---|
| 1,120,781 | A | 12/1914 | Altenkirch et al. |
| 2,362,259 | A | 11/1944 | Findley |
| 2,363,168 | A | 11/1944 | Findley |
| 2,519,241 | A | 8/1950 | Findley |
| 2,944,404 | A | 7/1960 | Fritts |
| 2,949,014 | A | 8/1960 | Belton, Jr. et al. |

(Continued)

FOREIGN PATENT DOCUMENTS

| | | |
|---|---|---|
| CN | 1195090 | 10/1998 |
| CN | 1236429 A | 11/1999 |

(Continued)

OTHER PUBLICATIONS

International Search Report PCT/US2006/025330, dated Jul. 11, 2007.

(Continued)

*Primary Examiner* — Matthew Martin
(74) *Attorney, Agent, or Firm* — Knobbe Martens Olson & Bear, LLP

(57) ABSTRACT

Traditional power generation systems using thermoelectric power generators are designed to operate most efficiently for a single operating condition. The present invention provides a power generation system in which the characteristics of the thermoelectrics, the flow of the thermal power, and the operational characteristics of the power generator are monitored and controlled such that higher operation efficiencies and/or higher output powers can be maintained with variably thermal power input. Such a system is particularly beneficial in variable thermal power source systems, such as recovering power from the waste heat generated in the exhaust of combustion engines.

20 Claims, 11 Drawing Sheets

(56) References Cited

U.S. PATENT DOCUMENTS

| | | | |
|---|---|---|---|
| 2,984,077 | A | 5/1961 | Gaskill |
| 3,004,393 | A | 10/1961 | Alsing |
| 3,006,979 | A | 10/1961 | Rich |
| 3,019,609 | A | 2/1962 | Pietsch |
| 3,071,495 | A | 1/1963 | Hanlein |
| 3,085,405 | A | 4/1963 | Frantti |
| 3,125,860 | A | 3/1964 | Reich |
| 3,129,116 | A | 4/1964 | Corry |
| 3,137,142 | A | 6/1964 | Venema |
| 3,178,895 | A | 4/1965 | Mole et al. |
| 3,197,342 | A | 7/1965 | Neild, Jr. |
| 3,212,275 | A | 10/1965 | Tillman, Jr. |
| 3,213,630 | A | 10/1965 | Mole |
| 3,252,504 | A | 5/1966 | Newton |
| 3,391,727 | A | 7/1968 | Topouszian |
| 3,505,728 | A | 4/1970 | Hare et al. |
| 3,527,621 | A | 9/1970 | Newton |
| 3,599,437 | A | 8/1971 | Panas |
| 3,607,444 | A | 9/1971 | Debucs |
| 3,626,704 | A | 12/1971 | Coe, Jr. |
| 3,635,037 | A | 1/1972 | Hubert |
| 3,663,307 | A | 5/1972 | Mole |
| 3,681,929 | A | 8/1972 | Schering |
| 3,779,814 | A | 12/1973 | Miles et al. |
| 3,817,043 | A | 6/1974 | Zoleta |
| 3,859,143 | A | 1/1975 | Krebs |
| 4,038,831 | A | 8/1977 | Gaudel et al. |
| 4,047,093 | A | 9/1977 | Levoy |
| 4,055,053 | A | 10/1977 | Elfving |
| 4,065,936 | A | 1/1978 | Fenton et al. |
| 4,125,122 | A | 11/1978 | Stachurski |
| 4,281,516 | A | 8/1981 | Berthet et al. |
| 4,297,841 | A | 11/1981 | Cheng |
| 4,297,849 | A | 11/1981 | Buffet |
| 4,420,940 | A | 12/1983 | Buffet |
| 4,448,028 | A | 5/1984 | Chao et al. |
| 4,494,380 | A | 1/1985 | Cross |
| 4,499,329 | A | 2/1985 | Benicourt et al. |
| 4,665,707 | A | 5/1987 | Hamilton |
| 4,730,459 | A | 3/1988 | Schlicklin et al. |
| 4,731,338 | A | 3/1988 | Ralston et al. |
| 4,753,682 | A | 6/1988 | Cantoni |
| 4,823,554 | A | 4/1989 | Trachtenberg et al. |
| 4,858,069 | A | 8/1989 | Hughes |
| 4,885,087 | A | 12/1989 | Kopf |
| 4,905,475 | A | 3/1990 | Tuomi |
| 4,988,847 | A | 1/1991 | Argos et al. |
| 4,989,626 | A | 2/1991 | Takagi et al. |
| 5,006,178 | A | 4/1991 | Bijvoets |
| 5,029,446 | A | 7/1991 | Suzuki |
| 5,038,569 | A | 8/1991 | Shirota et al. |
| 5,092,129 | A | 3/1992 | Bayes et al. |
| 5,097,829 | A | 3/1992 | Quisenberry |
| 5,111,664 | A | 5/1992 | Yang |
| 5,193,347 | A | 3/1993 | Apisdorf |
| 5,228,923 | A | 7/1993 | Hed |
| 5,232,516 | A | 8/1993 | Hed |
| 5,254,178 | A | 10/1993 | Yamada et al. |
| 5,296,534 | A | 3/1994 | Senuma et al. |
| 5,300,197 | A | 4/1994 | Mitani et al. |
| 5,385,020 | A | 1/1995 | Gwilliam et al. |
| 5,419,780 | A | 5/1995 | Suski |
| 5,419,980 | A | 5/1995 | Okamoto et al. |
| 5,429,680 | A | 7/1995 | Fuschetti |
| 5,448,891 | A | 9/1995 | Nakagiri et al. |
| 5,499,504 | A | 3/1996 | Mill et al. |
| 5,544,487 | A | 8/1996 | Attey et al. |
| 5,561,981 | A | 10/1996 | Quisenberry et al. |
| 5,563,368 | A | 10/1996 | Yamaguchi |
| 5,566,774 | A | 10/1996 | Yoshida |
| 5,584,183 | A | 12/1996 | Wright et al. |
| 5,592,363 | A | 1/1997 | Atarashi et al. |
| 5,594,609 | A | 1/1997 | Lin |
| 5,605,047 | A | 2/1997 | Park et al. |
| 5,682,748 | A | 11/1997 | DeVilbiss et al. |
| 5,705,770 | A | 1/1998 | Ogasawara et al. |
| 5,713,426 | A | 2/1998 | Okamura |
| 5,724,818 | A | 3/1998 | Iwata et al. |
| 5,802,856 | A | 9/1998 | Schaper et al. |
| 5,822,993 | A | 10/1998 | Attey |
| 5,860,472 | A | 1/1999 | Batchelder |
| 5,867,990 | A | 2/1999 | Ghoshal |
| 5,900,071 | A | 5/1999 | Harman |
| RE36,242 | E | 6/1999 | Apisdorf |
| 5,917,144 | A * | 6/1999 | Miyake et al. ............... 136/205 |
| 5,921,088 | A | 7/1999 | Imaizumi et al. |
| 5,955,772 | A | 9/1999 | Shakouri et al. |
| 5,959,341 | A | 9/1999 | Tsuno et al. |
| 5,966,941 | A | 10/1999 | Ghoshal |
| 5,975,856 | A | 11/1999 | Welle |
| 5,987,890 | A | 11/1999 | Chiu et al. |
| 6,000,225 | A | 12/1999 | Ghoshal |
| 6,028,263 | A | 2/2000 | Kobayashi et al. |
| 6,050,326 | A | 4/2000 | Evans |
| 6,082,445 | A | 7/2000 | Dugan |
| 6,084,172 | A | 7/2000 | Kishi et al. |
| 6,096,966 | A | 8/2000 | Nishimoto et al. |
| 6,119,463 | A | 9/2000 | Bell |
| 6,127,766 | A | 10/2000 | Roidt |
| 6,213,198 | B1 | 4/2001 | Shikata et al. |
| 6,223,539 | B1 | 5/2001 | Bell |
| 6,274,802 | B1 | 8/2001 | Fukuda et al. |
| 6,282,907 | B1 | 9/2001 | Ghoshal |
| 6,319,744 | B1 | 11/2001 | Hoon et al. |
| 6,320,280 | B1 | 11/2001 | Kanesaka |
| 6,334,311 | B1 | 1/2002 | Kim et al. |
| 6,346,668 | B1 | 2/2002 | McGrew |
| 6,347,521 | B1 | 2/2002 | Kadotani et al. |
| 6,359,725 | B1 | 3/2002 | Islam |
| 6,366,832 | B2 | 4/2002 | Lomonaco et al. |
| 6,367,261 | B1 | 4/2002 | Marshall et al. |
| 6,393,842 | B2 | 5/2002 | Kim |
| 6,401,462 | B1 | 6/2002 | Bielinski |
| 6,412,287 | B1 | 7/2002 | Hughes et al. |
| 6,446,442 | B1 | 9/2002 | Batchelor et al. |
| 6,477,844 | B2 | 11/2002 | Ohkubo et al. |
| 6,481,213 | B2 | 11/2002 | Carr et al. |
| 6,510,696 | B2 | 1/2003 | Guttman et al. |
| 6,530,231 | B1 | 3/2003 | Nagy et al. |
| 6,530,842 | B1 | 3/2003 | Wells et al. |
| 6,530,920 | B1 | 3/2003 | Whitcroft et al. |
| 6,539,725 | B2 | 4/2003 | Bell |
| 6,539,729 | B2 | 4/2003 | Tupis et al. |
| 6,541,139 | B1 | 4/2003 | Cibuzar |
| 6,560,968 | B2 | 5/2003 | Ko |
| 6,563,039 | B2 | 5/2003 | Caillat et al. |
| RE38,128 | E | 6/2003 | Gallup et al. |
| 6,580,025 | B2 | 6/2003 | Guy |
| 6,598,403 | B1 | 7/2003 | Ghoshal |
| 6,598,405 | B2 | 7/2003 | Bell |
| 6,605,773 | B2 | 8/2003 | Kok et al. |
| 6,606,866 | B2 | 8/2003 | Bell |
| 6,625,990 | B2 | 9/2003 | Bell |
| 6,637,210 | B2 | 10/2003 | Bell |
| 6,650,968 | B2 | 11/2003 | Hallum et al. |
| 6,653,002 | B1 | 11/2003 | Parise |
| 6,672,076 | B2 * | 1/2004 | Bell ............................. 62/3.3 |
| 6,807,811 | B2 | 10/2004 | Lee |
| 6,812,395 | B2 | 11/2004 | Bell |
| 6,886,356 | B2 | 5/2005 | Kubo et al. |
| 6,907,739 | B2 | 6/2005 | Bell |
| 6,948,321 | B2 | 9/2005 | Bell |
| 6,959,555 | B2 | 11/2005 | Bell |
| 6,975,060 | B2 | 12/2005 | Styblo et al. |
| 6,986,247 | B1 | 1/2006 | Parise |
| 7,100,369 | B2 * | 9/2006 | Yamaguchi et al. ............ 60/324 |
| 7,111,465 | B2 | 9/2006 | Bell |
| 7,231,772 | B2 | 6/2007 | Bell |
| 7,246,496 | B2 | 7/2007 | Goenka et al. |
| 7,273,981 | B2 | 9/2007 | Bell |
| 7,421,845 | B2 | 9/2008 | Bell |
| 7,426,835 | B2 | 9/2008 | Bell |
| 7,587,902 | B2 | 9/2009 | Bell |
| 7,608,777 | B2 | 10/2009 | Bell et al. |

(56) References Cited

U.S. PATENT DOCUMENTS

| | | |
|---|---|---|
| 7,629,530 B2 | 12/2009 | Inaoka |
| 2001/0005990 A1 | 7/2001 | Kim |
| 2001/0029974 A1 | 10/2001 | Cohen et al. |
| 2002/0014261 A1 | 2/2002 | Caillat et al. |
| 2003/0029175 A1 | 2/2003 | Lee |
| 2003/0094265 A1 | 5/2003 | Chu et al. |
| 2004/0045594 A1 | 3/2004 | Hightower |
| 2004/0055312 A1 | 3/2004 | Bell |
| 2004/0076214 A1 | 4/2004 | Bell |
| 2004/0177876 A1 | 9/2004 | Hightower |
| 2004/0221577 A1* | 11/2004 | Yamaguchi et al. ............ 60/520 |
| 2004/0261829 A1 | 12/2004 | Bell |
| 2004/0261831 A1 | 12/2004 | Tsuneoka |
| 2004/0267408 A1 | 12/2004 | Kramer |
| 2005/0000473 A1 | 1/2005 | Ap et al. |
| 2005/0074646 A1 | 4/2005 | Rajashekara et al. |
| 2005/0105224 A1 | 5/2005 | Nishi |
| 2005/0172993 A1 | 8/2005 | Shimoji et al. |
| 2005/0194034 A1 | 9/2005 | Yamaguchi et al. |
| 2005/0217714 A1 | 10/2005 | Nishijima et al. |
| 2005/0247336 A1 | 11/2005 | Inaoka |
| 2005/0263176 A1 | 12/2005 | Yamaguchi et al. |
| 2005/0263177 A1 | 12/2005 | Bell |
| 2006/0005548 A1 | 1/2006 | Ruckstuhl |
| 2006/0075758 A1 | 4/2006 | Rice et al. |
| 2006/0130888 A1 | 6/2006 | Yamaguchi et al. |
| 2006/0150657 A1 | 7/2006 | Spurgeon et al. |
| 2006/0157102 A1 | 7/2006 | Nakajima |
| 2006/0174633 A1 | 8/2006 | Beckley |
| 2006/0188418 A1 | 8/2006 | Yoon et al. |
| 2007/0000255 A1 | 1/2007 | Elliot et al. |
| 2007/0033951 A1 | 2/2007 | Goenka et al. |
| 2007/0193617 A1 | 8/2007 | Taguchi |
| 2007/0220902 A1 | 9/2007 | Matsuoka et al. |
| 2007/0272290 A1 | 11/2007 | Sims et al. |
| 2008/0035195 A1 | 2/2008 | Bell |
| 2008/0083445 A1 | 4/2008 | Chakraborty |
| 2008/0173342 A1 | 7/2008 | Bell |
| 2008/0245398 A1 | 10/2008 | Bell |
| 2008/0250794 A1 | 10/2008 | Bell |
| 2008/0289677 A1 | 11/2008 | Bell |
| 2008/0307796 A1 | 12/2008 | Bell et al. |
| 2009/0000310 A1 | 1/2009 | Bell et al. |
| 2009/0007572 A1 | 1/2009 | Bell et al. |
| 2009/0007952 A1 | 1/2009 | Kondoh et al. |
| 2009/0139556 A1 | 6/2009 | Bell et al. |
| 2009/0293499 A1 | 12/2009 | Bell et al. |
| 2009/0301103 A1 | 12/2009 | Bell et al. |
| 2009/0301539 A1 | 12/2009 | Watts |
| 2010/0024859 A1 | 2/2010 | Bell et al. |
| 2010/0031987 A1 | 2/2010 | Bell |
| 2010/0031988 A1 | 2/2010 | Bell |
| 2010/0052374 A1 | 3/2010 | Bell |
| 2010/0095996 A1 | 4/2010 | Bell |
| 2010/0101238 A1 | 4/2010 | LaGrandeur |
| 2010/0101239 A1 | 4/2010 | LaGrandeur |
| 2010/0236595 A1 | 9/2010 | Bell |
| 2010/0326092 A1 | 12/2010 | Goenka |
| 2011/0067742 A1 | 3/2011 | Bell et al. |
| 2012/0111386 A1 | 5/2012 | Bell et al. |

FOREIGN PATENT DOCUMENTS

| | | |
|---|---|---|
| CN | 1249067 A | 3/2000 |
| CN | 1343294 A | 4/2002 |
| DE | 13 01 454 B | 8/1969 |
| DE | 43 29 816 | 3/1994 |
| EP | 0 389 407 A | 9/1990 |
| EP | 0 545 021 A | 6/1993 |
| EP | 0834421 | 4/1998 |
| EP | 0 878 851 | 11/1998 |
| EP | 1 174 996 A1 | 1/2002 |
| EP | 1 324 400 A | 7/2003 |
| EP | 1475532 A | 11/2004 |
| EP | 1 515 376 | 3/2005 |
| EP | 1 641 067 | 3/2006 |
| EP | 1679480 | 7/2006 |
| EP | 2 378 577 | 12/2012 |
| FR | 1 280 711 A | 1/1962 |
| FR | 2 261 638 A | 9/1975 |
| FR | 2 419 479 A | 10/1979 |
| FR | 2 543 275 | 9/1984 |
| FR | 2 512 499 | 10/1984 |
| FR | 2 550 324 A | 2/1985 |
| FR | 2 879 728 A | 6/2006 |
| GB | 231 192 A | 5/1926 |
| GB | 817 077 | 7/1959 |
| GB | 952 678 | 3/1964 |
| GB | 1 040 485 A | 8/1966 |
| GB | 1151947 | 5/1969 |
| GB | 2 027 534 | 2/1980 |
| GB | 2 267 338 | 12/1993 |
| GB | 2 333 352 | 7/1999 |
| JP | 56-18231 | 2/1981 |
| JP | 59-097457 | 6/1984 |
| JP | 60-80044 | 7/1985 |
| JP | 63-262076 A | 10/1988 |
| JP | 01 131830 A | 5/1989 |
| JP | 01 200122 | 8/1989 |
| JP | 01-281344 | 11/1989 |
| JP | 03-102219 A2 | 4/1991 |
| JP | 04 103925 | 4/1992 |
| JP | 4-165234 | 6/1992 |
| JP | 05-195765 | 8/1993 |
| JP | 5-219765 | 8/1993 |
| JP | 6-342940 | 12/1994 |
| JP | 7-007187 A | 1/1995 |
| JP | 7-198284 | 1/1995 |
| JP | 07-074397 | 3/1995 |
| JP | 07-54189 | 6/1995 |
| JP | 7 156645 | 6/1995 |
| JP | A-7-202275 | 8/1995 |
| JP | 07-253224 | 10/1995 |
| JP | 07253264 | 2/1996 |
| JP | 08-098569 | 4/1996 |
| JP | 08-222771 | 8/1996 |
| JP | A-8-293627 | 11/1996 |
| JP | 09042801 | 2/1997 |
| JP | 09-092761 | 4/1997 |
| JP | 09-254630 | 9/1997 |
| JP | 09-275692 | 10/1997 |
| JP | 09-276076 | 10/1997 |
| JP | 10-012935 | 1/1998 |
| JP | 10 163538 | 6/1998 |
| JP | 10-163538 | 6/1998 |
| JP | 10-275943 | 10/1998 |
| JP | 10290590 A | 10/1998 |
| JP | 11-317481 | 11/1998 |
| JP | H10-325561 | 12/1998 |
| JP | 11-046021 | 2/1999 |
| JP | 11-182907 | 7/1999 |
| JP | 11-201475 A | 7/1999 |
| JP | 11-274574 | 10/1999 |
| JP | 11 274575 | 10/1999 |
| JP | 11-041959 | 12/1999 |
| JP | 2000 018095 | 1/2000 |
| JP | H2000-58930 | 2/2000 |
| JP | 2000-185542 | 7/2000 |
| JP | 2000-208823 | 7/2000 |
| JP | 2002-21534 | 7/2000 |
| JP | H2000-214934 | 8/2000 |
| JP | 2000-274788 | 10/2000 |
| JP | 2000-274871 A | 10/2000 |
| JP | 2000-274874 | 10/2000 |
| JP | 2000-286469 A | 10/2000 |
| JP | 2000 286469 A | 10/2000 |
| JP | 2000-323759 | 11/2000 |
| JP | 2001-24240 | 1/2001 |
| JP | 2001-210879 | 8/2001 |
| JP | 2001-267642 A | 9/2001 |
| JP | 2001-336853 | 1/2002 |
| JP | 2002-13758 | 1/2002 |
| JP | 2002 111078 | 4/2002 |

(56) References Cited

FOREIGN PATENT DOCUMENTS

| JP | 2002-199761 | 7/2002 |
|---|---|---|
| JP | 2002 232028 A | 8/2002 |
| JP | 2002 325470 | 11/2002 |
| JP | 2003-86223 | 3/2003 |
| JP | 2003175720 A | 6/2003 |
| JP | 2003 259671 | 9/2003 |
| JP | 2003 332642 | 11/2003 |
| JP | 2004 079883 | 3/2004 |
| JP | 2004-332596 | 11/2004 |
| JP | 2004 343898 | 12/2004 |
| JP | 2004-360522 | 12/2004 |
| JP | 2005-212564 | 8/2005 |
| JP | 07 111334 | 10/2005 |
| JP | 2005 317648 | 11/2005 |
| JP | 2006 214350 | 8/2006 |
| JP | 2008 042994 | 2/2008 |
| JP | 2008 274790 | 11/2008 |
| JP | 2008 300465 | 12/2008 |
| JP | 2009 033806 | 2/2009 |
| LU | 66619 | 2/1973 |
| RU | 2 099 642 C1 | 12/1997 |
| RU | 2 142 178 C1 | 11/1999 |
| RU | 2 154 875 C2 | 8/2000 |
| RU | 2174475 | 10/2001 |
| SE | 329 870 | 10/1970 |
| SE | 337 227 | 8/1971 |
| SU | 184886 A | 7/1966 |
| SU | 1142711 A | 2/1985 |
| SU | 1170234 A | 7/1985 |
| SU | 1196627 A | 12/1985 |
| WO | WO 95/01500 | 1/1995 |
| WO | WO 97/47930 | 12/1997 |
| WO | WO 99/58907 | 11/1999 |
| WO | WO 01/52332 | 7/2001 |
| WO | WO 02/00458 | 1/2002 |
| WO | WO 03/074951 A1 | 9/2003 |
| WO | WO 03/090286 A | 10/2003 |
| WO | WO 2004/092662 | 10/2004 |
| WO | WO 2005/023571 | 3/2005 |
| WO | WO 2005/098225 A | 10/2005 |
| WO | WO 2006/037178 A | 4/2006 |
| WO | WO 2006/043514 A | 4/2006 |
| WO | WO 2006/064432 A | 6/2006 |
| WO | WO 2007/001289 | 1/2007 |
| WO | WO 2008/042077 | 4/2008 |
| WO | WO 2008/123330 | 10/2008 |
| WO | WO 2010/014958 | 2/2010 |
| WO | WO 2010/048575 | 4/2010 |
| WO | WO 2010/135173 | 11/2010 |
| WO | WO 2012/170443 | 12/2012 |

OTHER PUBLICATIONS

Bell, L.E., "Alternate Thermoelectric Thermodynamic Cycles with Improved Power Generation Efficiencies" Thermoelectrics, 2003 Twenty-Second International Conference on—*ICT La Grande Motte, France* Aug. 17-21, 2003, Piscataway, NJ, USA, IEEE, Aug. 17, 2003, pp. 558-562, XP010697375, ISBN: 0-7803-8301-X.
Bell, L.E., "Use of Thermal Isolation to Improve Thermoelectric system Operating Efficiency," Thermoelectrics, 2002. Proceedings ICT '02. Twenty-First International Conference on Aug. 25, 2002, Piscataway, NJ, USA, IEEE, Aug. 25, 2002, pp. 477-487, XPO10637528, ISBN: 0-7803-7683-8.
Buist, R.J. et al. "A New Concept for Improving Thermoelectric Heat Pump Efficiency", Borg-Warner Thermoelectrics Wolf and Algonquin Road, pp. 60-63, 1976.
Buist, R., et al. "Theoretical Analysis of Thermoelectric Cooling Performance Enhancement Via Thermal and Electrical Pulsing", Journal of Thermoelectricity, No. 4, 1996.
Crane, D. T., et al.: "Progress Towards Maximizing the Performance of a Themoelectric Power Generator", Thermoelectrics, 2006. ICT '06. 25th International Conference on, IEEE, PI, Aug. 1, 2006, pp. 11-16, XP031062639, ISBN: 978-1-4244-0810-8 the whole document.

CRC Handbook of Thermoelectrics, ed. D.M. Rowe, Chapter 54, Medium-Scale Cooling: Thermoelectrice Technology and Chap. 55, Modeling of Thermoelectric Cooling Systems, (ISBN: 0-8493-0146-7), Jul. 1995, pp. 667-683.
Database WPI Week 198227 Thomson Scientific, London, GB; AN 1982-J1035E, XP002485188 & SU 861 869 B (Bochin G V) Sep. 7, 1981 & SU 861 869 A1 (Bochin German V [SU]; Butyrskij Velentin; Kochkarev Vladimir; Kubalov) Sep. 7, 1981.
Diller, R. W., et al.: "Experimental results confirming improved performance of systems using thermal isolation" Thermoelectrics, 2002. Proceedings ICT '02. Twenty-First International Conference on Aug. 25-29, 2002, Piscataway, NJ USA, IEEE, Aug. 25, 2002, pp. 548-550, XP010637541 ISBN: 0-7803-7683-8.
Diller, R.W., et al., "Experimental Results Confirming Improved Efficiency of Thermoelectric Power Generation Systems with Alternate Thermodynamic Cycles," 22nd International Conference on Thermoelectrics, 2003, pp. 571-573.
Fleurial, J-P, et al.: "Development of Segmented Thermoelectric Multicouple Converter Technology" Aerospace Conference, 2006 IEEE Big Sky, MT, USA Mar. 4-11, 2006, Piscataway, NJ, USA, IEEE, Mar. 4, 2006, pp. 1-10, XP010928672 ISBN: 978-07803-9545-9.
Goldsmid, H.J., "Electronic Refrigeration", Pion Ltd, 207 Brondesbury Park, London (1986).
Kwon, H., et al., Hyundai Motor Co., corresponding to KR 9706106 A, published Jun. 24, 1997 (2 pages), Derwent-Acc-No. 1998-283540.
Miner, A., et al. "Thermo-Electro-Mechanical Refrigeration Based on Transient Thermoelectric Effects", Applied Physics letters, vol. 75, pp. 1176-1178 (1999).
Tada, S., et al., "A New Concept of Porous Thermoelectric Module Using a Reciprocating Flow for Cooling/Heating Systems (Numerical Analysis for Heating Systems)" 16th International Conference on Thermoelectrics (1977).
International Preliminary Report on Patentability for International Application No. PCT/US2006/025330, dated Mar. 5, 2008 in 7 pages.
Angrist, Direct Energy Conversion, Third Edition, Ed. Ally & Bacon, Chap. 4 (1976).
Bass, J.C. et al., *Performance of the 1 kW Thermoelectric Generator for Diesel Engines*, American Institute of Physics, 1995, p. 295-298.
Bell Lon E., *High Power Density Thermoelectric Systems*, BSST LLC, Irwindale, California, Proc. of $23^{rd}$ Int'l Conf. on Thermoelectrics, Jul. 2004.
Bell, Lon E., *Increased Thermoelectric System Thermodynamic Efficiency by Use of Convective Heat Transport*, BSST LLC, Irwindale, California, Proc. $21^{st}$ Int'l Conf. on Thermoelectrics, Aug. 2002.
Birkholz, Ulrich et al., *Conversion of Waste Exhaust Heat in Automobiles Using $FeSi_2$.Thermoelements*, $7^{th}$ International Conference on TE Energy Conversion, p. 124-128, 1988.
BSST LLC, *Freedom Car & Vehicle Technologies Program*, BSST LLC Project Phase 1 Report : High Efficiency Thermoelectric Waste Energy Recovery System for Passenger Vehicle Application, U.S. Department of Energy, Jun. 1, 2005, p. 1-95.
Cobble, Milan H., Calculations of Generator Performance, CRC Press, Inc. 1995, p. 489.
Crane, D.T., *Modeling High-Power Density Thermoelectric Assemblies Which Use Thermal Isolation*, BSST LLC, Irwindale, California, Proc. of $23^{rd}$ Int'l Conf. on Thermoelectrics, Jul. 2004.
Crane, Douglas T., *Optimizing Thermoelectric Waste Heat Recovery From an Automobile Cooling System*, Dissertation submitted to the Faculty of Graduate School of the University of Maryland, 2003.
Hendricks, Terry et al., *Advanced Thermoelectric Power System Investigations for Light-Duty and Heavy Duty Applications*, National Renewable Energy Laboratory, Center for Transportation Technology & Systems, Colorado, Proc. $21^{st}$ Int'l Conf. on Thermoelectrics, Aug. 2002, pp. 381-386.
Hsu, Kuei Fang et al., *Cubic $AgPb_mSbTe_{2+m}$: Bulk Thermoelectric Materials with High Figure of Merit*, Science, Feb. 6, 2004, p. 818-821, vol. 303.
Ikoma et al., *Thermoelectric Module and Generator for Gasoline Engine Vehicles*, $17^{th}$ International Conference on Thermoelectrics, 1998, p. 464-467.

(56) References Cited

OTHER PUBLICATIONS

Lofy, John et al., *Thermoelectrics for Environmental Control in Automobiles*, 21st International Conference on Thermoelectronics, 2002, p. 471-476.

Menchen, William R. et al., *Thermoelectric Conversion to Recover Heavy Duty Diesel Exhaust Energy*, Teledyne Energy Systems, Timonium, MD, 1990, SAE Proc. of the Annual Automotive Tech. Dev. Contractor's Meeting, pp. 445-449.

Snyder, G. Jeffrey et al., *Thermoelectric Efficiency and Compatibility*, The American Physical Society, Oct. 2, 2003, vol. 91, No. 14.

Snyder, G. Jeffrey, *Application of the Compatibility Factor to the Design of Segmented and Cascaded Thermoelectric Generators*, Applied Physics Letters, Mar. 2004.

Ursell, T.S. et al., *Compatibility of Segmented Thermoelectric Generators*, 21st International Conference on Thermoelectronics, 2002, p. 412-417.

Bell, Lon E., *High Power Density Thermoelectric Systems*, BSST LLC, Irvindale, California.

Bell, Lon E., *Increased Thermoelectric System Thermodynamic Efficiency by Use of Convective Heat Transport*, BSST LLC, Irvindale, California.

Birkholz, Ulrich et al., *Conversion of Waste Exhaust Heat in Automobiles Using $FeSi_2$- Thermoelements*, 7th International Conference on TE Energy Conversion, p. 124-128.

Crane, D.T., *Modeling High-Power Density Thermoelectric Assemblies Which Use Thermal Isolation*, BSST LLC, Irvindale, California.

Hendricks, Terry et al., *Advanced Thermoelectric Power System Investigations for Light-Duty and Heavy Duty Applications*, National Renewable Energy Laboratory, Center for Transportation Technology & Systems, Colorado.

Ikoma, I et al., *Thermoelectric Module and Generator for Gasoline Engine Vehicles*, 17th International Conference on Thermoelectrics, 1998, p. 464-467.

Menchen, William R. et al., *Thermoelectric Conversion to Recover Heavy Duty Diesel Exhaust Energy*, Teledyne Energy Systems, Timonium, MD.

English Translation of Japanese Office Action dated Apr. 3, 2012 for Japanese Application No. 2008-519561 in 2 pages.

Crane, D. T.: "Progress Towards Maximizing the Performance of a Thermoelectric Power Generator", ICT '06, 25th, USA, IEEE, Aug. 1, 2006, 11-16I.

Extended Search Report in co-pending European Application No. 10188477.3, dated Oct. 19, 2012 in 6 pages.

Fleurial, et al., "Development of Segmented Thermoelectric Multicopule Converter Technology," Aerospace Conference, 2006 IEEE Big Sky, Mt., Mar. 4-11, 2006, pp. 1-10.

Menchen, et al., "Thermoelectric Conversion to Recover Heavy Duty Diesel Exhaust Energy", Proceedings of the Annual Automotive Technology Development Contractors Meeting, pp. 445-449, Apr. 1991.

Questioning in co-pending Japanese Application No. 2008-519561 with English translation, mailed Oct. 9, 2012 in 7 pages.

\* cited by examiner

THERMOELECTRIC POWER GENERATOR FOR VARIABLE THERMAL POWER SOURCE

CROSS-REFERENCE TO RELATED APPLICATIONS

This application relates to and claims the benefit of priority of U.S. Provisional Patent Application No. 60/694,746 entitled "High-Efficiency Thermoelectric Waste Energy Recovery System for Passenger Vehicle Applications," filed Jun. 28, 2005.

STATEMENT REGARDING FEDERALLY SPONSORED R&D

The U.S. Government may claim to have certain rights in this invention or parts of this invention under the terms of Contract No. DE-FC26-04NT42279 awarded by the U.S. Department of Energy.

BACKGROUND OF THE INVENTION

1. Field of the Invention

The present application relates to the field of thermoelectric power generation, and more particularly to systems for improving the generation of power from thermoelectrics where the heat source varies in temperature and heat flux.

2. Description of the Related Art

Thermoelectrics are solid state devices that operate to become cold on one side and hot on the other side when electrical current passes through. They can also generate power by maintaining a temperature differential across the thermoelectric. Under many operating conditions, however, thermoelectric power generators are exposed to a combination of changing heat fluxes, hot side heat source temperatures, cold side heat rejection temperatures, and other variable conditions. In addition, the device properties, such as TE thermal conductance, Figure of Merit Z, heat exchanger performance all have a range of manufacturing tolerances that combine to, in general, reduce device performance. As a result, performance varies and operation at a predetermined set point can lead to performance degradation compared to design values.

Any process that consumes energy that is not 100% efficient generates waste energy, usually in the form of heat. For example, internal combustion engines generate a substantial amount of waste heat. In order to improve the efficiency of the internal combustion engine; such as in automobiles, various ways to capture some of this waste heat and convert it to a useful form have been considered. Placing thermoelectrics on the exhaust system of an automobile has been contemplated (See U.S. Pat. No. 6,986,247 entitled Thermoelectric Catalytic Power Generator with Preheat). However, because the exhaust system varies greatly in heat and heat flux, providing a system that is effective has been illusive. By way of example, compared to optimal performance, degradation in automobile waste heat recovery system performance can be very significant, amounting to at least 30%.

SUMMARY OF THE INVENTION

This invention is directed to improvement to thermoelectric generation systems, particularly where the thermal power source is one of variable thermal output. Improvements may be obtained by controlling the operation of the system so as to maintain meaningful proximity to optimal operating efficiencies. The system is designed to reduce losses from both the variations from changing operating conditions and the differences associated with design and fabrication differences.

In one embodiment, a thermoelectric power generation system has a source of thermal power, a thermoelectric generator having at least two thermoelectric modules, a thermal power delivery system controllable to deliver thermal power from the thermal power source to one of the at least two thermoelectric modules and to deliver thermal power from the thermal power source to both of the at least two thermoelectric modules. A controller is preferably in communication with the thermal power delivery system to provide control for the delivery of thermal power.

Advantageously, the thermoelectric power generation system is controllable to deliver thermal power from the thermal power source to one of the at least two thermoelectric modules and to deliver thermal power from the thermal power source to the other of the at least two thermoelectric modules and to deliver thermal power to both of the at least two thermoelectric modules. Of-course, the system isn't limited to two thermoelectric modules, but could be any number of modules. Preferably, the controller can deliver power to a variety of combinations of differing capacity thermoelectrics so as to enhance efficient power production. In one embodiment, the thermal power delivery system uses a hot-side working fluid, with the flow rate of the hot-side working fluid is controllable via the controller. An output is preferably adapted to move waste heat from the thermoelectric generator. The controller is in communication with the output to control the cooling conditions provided by the output. In one embodiment, the thermoelectric generator further has a cold-side working fluid in thermal communication with the output, wherein the controller is adapted to control the cold-side working fluid flow rate to control the operating properties of the thermoelectric modules.

Another aspect of the present invention involves a thermoelectric power generation system for use with an engine, the system has a thermoelectric generator having an input adapted to receive thermal power from a thermal power source, and further has an output adapted to move waste heat from the thermoelectric generator. An output delivery system is adapted to direct the waste heat to at least two locations, and a controller is in communication with the output delivery system. The controller is adapted to select at least one of the at least two locations for delivery of the waste heat.

Preferably, one of the at least two locations is a radiator of the engine. In one embodiment, the engine is in a vehicle adapted to carry occupants, and one of the at least two locations is the occupant compartment. Preferably, the controller is adapted to control the removal of waste heat from the cold side, and the controller causes the thermoelectric generator to operate substantially efficiently as the thermal power varies. In one embodiment, the thermoelectric generator has at least two thermoelectric modules, and the controller directs thermal power to at least one of the two thermoelectric modules during certain conditions and directs thermal power to both of the at least two thermoelectric modules during other conditions of varying thermal power. Preferably, the at least two thermoelectric modules are of differing capacity. In one embodiment, the thermoelectric generator has at least three thermoelectric modules, and the controller directs thermal power to any one of the thermoelectric modules. Of-course, any number of thermoelectric modules could be used as appropriate to match the available thermal power.

Another aspect of the invention involves a method of generating power from a variable thermal power source. The method involves directing thermal power to a hot-side input to a thermoelectric generator; removing waste heat from a cold-side output of the thermoelectric generator, and controlling the directing of thermal power in a manner to cause the thermoelectric generator to operate substantially efficiently as the thermal power varies.

In one embodiment, the method further involves the step of controlling the removing of waste heat from the cold-side output to cause the thermoelectric generator to operate substantially efficiently as the thermal power varies. Advantageously, the thermoelectric generator has at least two thermoelectric modules, and the step of controlling involves directing thermal power to at least one of the two thermoelectric modules during certain conditions and directing thermal power to both of the at least two thermoelectric modules during other conditions of varying thermal power. Of-course, the any number of a thermoelectric modules could be used, with the controller advantageously adapted to direct thermal power to combinations of the thermoelectric modules to adjust the capacity of the thermoelectric generator to the thermal power in.

In one embodiment, the thermoelectric generator has at least three thermoelectric modules, and the step of controlling involves directing thermal power to any one of the thermoelectric modules. Preferably, the properties of the thermoelectric modules differ, and the step of controlling further involves directing thermal power to any combination of the thermoelectric modules to achieve substantially optimal operating efficiency. Alternatively, the step of controlling involves directing thermal power to any combination of the thermoelectric modules to achieve substantially maximum operating power. In yet another embodiment, the step of controlling involves directing thermal power to any combination of the thermoelectric modules to achieve a desired level of operation for operating efficiency and power production.

DETAILED DESCRIPTION OF THE PREFERRED EMBODIMENT

Figure 1:
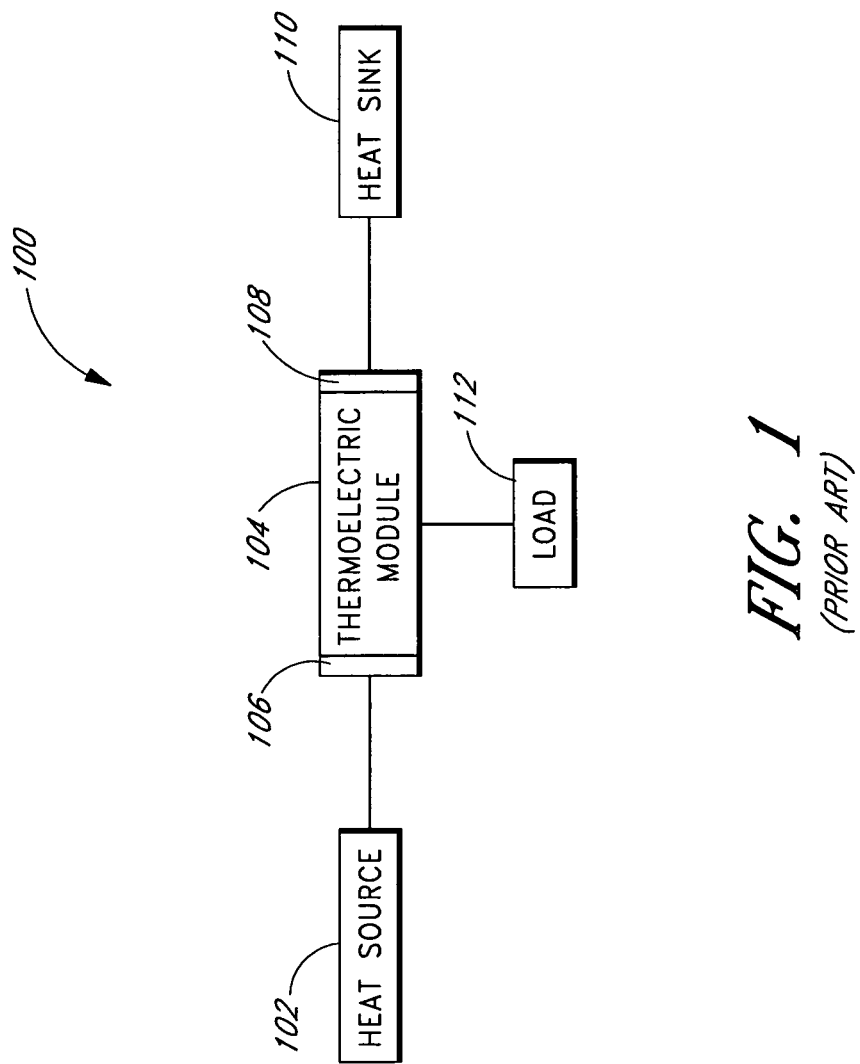
FIG. 1 depicts a generalized block diagram of a conventional power generation system using thermoelectrics.

The present invention relates to a thermoelectric power generation system which is capable of generating power more efficiently than a standard system, particularly suited for a thermal power source with variable thermal output. The present invention is useful for many waste heat recovery, waste heat harvesting and power generation applications. However, in order to illustrate the invention, a specific embodiment is described. The particular embodiment that is presented is the use of a thermoelectric generator to generate electrical power from thermal power contained in the exhaust of a vehicle. This particular example illustrates the advantage of designing the power generation system to monitor and control the conditions that affect power production, even under varying operating conditions. Substantial improvements can be derived by controlling TE couple properties, for example as describe in U.S. Pat. No. 6,672,076, entitled Efficiency Thermoelectrics Utilizing Convective Heat Flow, working fluid mass flow, operating current (or voltage), TE element form factor and system capacity. This patent is incorporated by reference herein. Improvements can also be obtained by designing the thermoelectric system to have thermal isolation in the direction of flow as described in U.S. Pat. No. 6,539,725 entitled Efficiency Thermoelectric Utilizing Thermal Isolation which is also incorporated by reference herein. Thus, in one embodiment, it is desirable to control the number of thermoelectric couples activated to produce power, to control the cooling conditions, to control cooling fluid flow rate, and/or to control temperatures and TE material properties.

Automotive waste heat recovery is used as an example of the present invention. However, the invention is applicable to improve the performance of power generation, waste heat recovery, cogeneration, power production augmentation, and other uses. As further examples, the present invention can be used to utilize waste heat in the engine coolant, transmission oil, brakes, catalytic converters, and other sources in cars, trucks, busses, trains, aircraft and other vehicles. Similarly, waste heat from chemical processes, glass manufacture, cement manufacture, and other industrial processes can be utilized. Other sources of waste heat such as from biowaste, trash incineration, burn off from refuse dumps, oil well burn off, can be used. Power can be produced from solar, nuclear, geothermal and other heat sources. Application to portable, primary, standby, emergency, remote, personal and other power production devices are also part of this invention. In addition, the present invention can be coupled to other devices in cogeneration systems, such as photovoltaic, fuel cell, fuel cell reformers, nuclear, internal, external and catalytic combustors, and other advantageous cogeneration systems. It should also be understood that the number of TE modules described in any embodiment herein is not of any import, but is merely selected to illustrate the invention.

The present invention is introduced using examples and particular embodiments for descriptive and illustrative purposes. Although examples are presented to show how various configurations can be employed to achieve the desired improvements, the particular embodiments are only illustrative and not intended in any way to restrict the inventions presented. It should also be noted that the term thermoelectric or thermoelectric element as used herein can mean individual thermoelectric elements as well as a collection of elements or arrays of elements. Further, the term thermoelectric is not restrictive, but used to include thermoionic and all other solid-state cooling and heating devices. In addition, the terms hot and cool or cold are relative to each other and do not indicate any particular temperature relative to room temperature or the like. Finally, the term working fluid is not limited to a single fluid, but can refer to one or more working fluids.

The particular illustrations herein depict just a few possible embodiment of a TE generator in accordance with the present invention. Other variations are possible and are part of the present invention. The system could consist of at least 2, but any number of TE modules that can operate at least partially independent of each other. Advantageously each such TE module has a different capacity, as depicted by being different sizes in as described in more detail in connection with FIG. 10. By having TE modules of different capacity, and the ability to switch thermal power to activate or remove each TE module independently from operation, allows the controller explained herein to adapt to substantially changing operational conditions.

Automotive exhaust provides waste heat from the engine. This waste heat can be used as a source of thermal power for generation of electrical power using thermoelectric generators. This particular application is chosen for description of the invention because it provides a good example of highly variable operating conditions, in which thermal power output of the exhaust varies continually. The actual temperature and heat flux of the exhaust, which is used as the input thermal power source for the thermoelectric power generation system, varies substantially. Exhaust temperatures at the outlet of a catalytic converter typically vary from 450 to 650° C. and exhaust heat flux varies often more than a factor of 10 between idle and rapid acceleration conditions. Thus, this particular application provides a good example for an understanding of the present invention.

FIG. 1 illustrates a simply thermoelectric power generation system 100, in accordance with the prior art. A thermal power source 102 provides heat to the hot side of a thermoelectric module 104. Preferably, the thermoelectric module 104 has a hot-side heat exchanger 106 and a cold-side heat exchanger 108. The cold-side heat exchanger provides a thermal power conduit for heat not used in the formation of electricity by the thermoelectric module 104. Typically, a heat sink 110, such as air or a liquid coolant, circulates to eliminate the waste heat from the thermoelectric generator. The temperature gradient across the thermoelectric module 104 generates electrical current to power a load 112.

Such a thermoelectric power generator 100 is typically designed for a steady state operation, in order to maintain the thermoelectric operation at or substantially close to peak efficiency. When conditions vary from these design criteria, the thermoelectric efficiency drops, or can even become negative, as further explained with reference to FIGS. 2-4.

Figure 2:
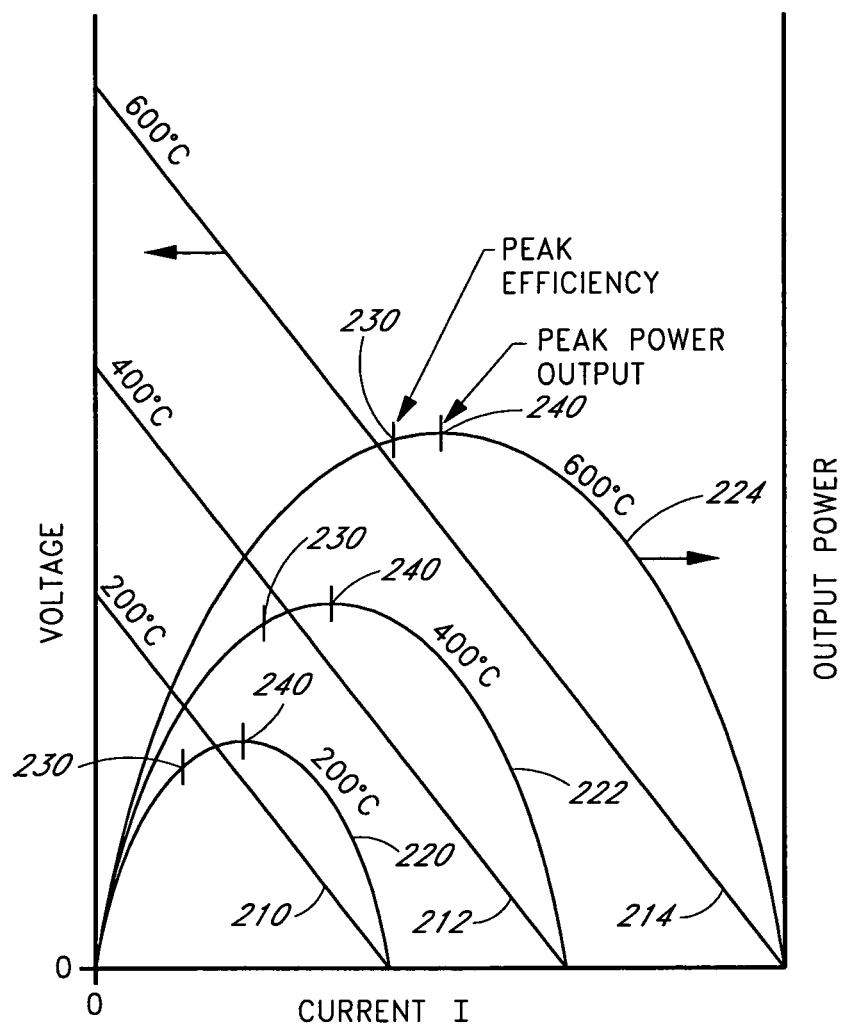
FIG. 2 is a graph illustrating voltage relative to current. with an overlay of power output for a thermoelectric module at various operating temperatures.
Figure 3:
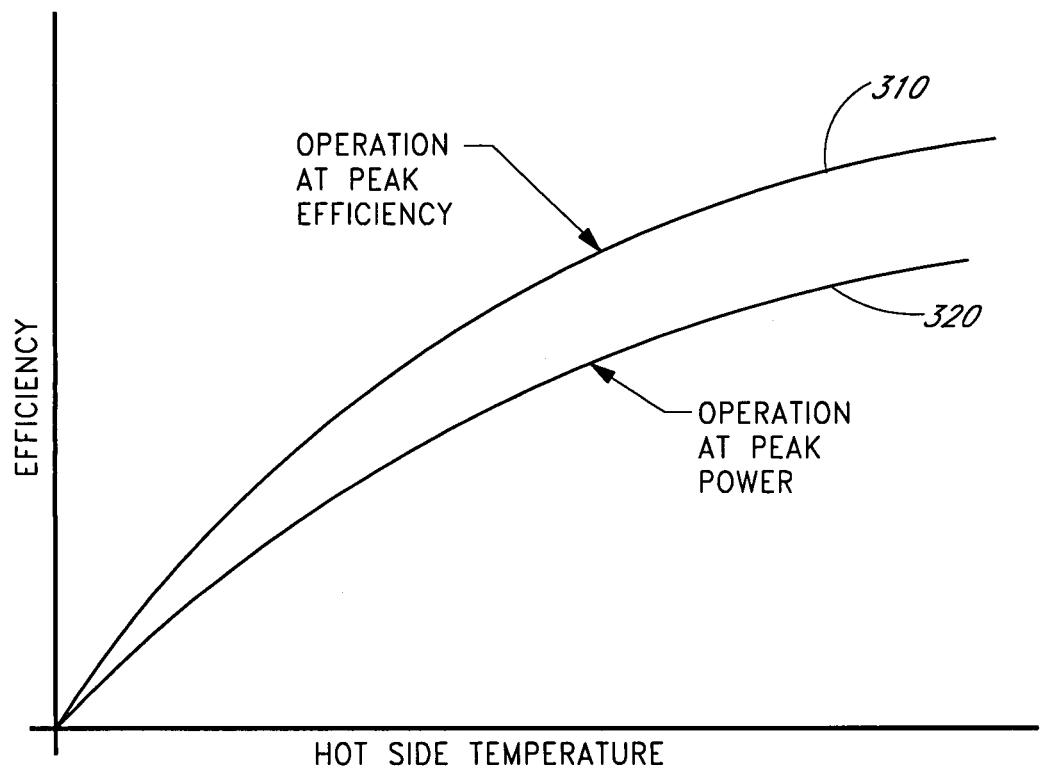
FIG. 3 is a graph illustrating efficiency relative to the hot side temperature of a thermoelectric module, identifying operating points at theoretical peak efficiency and at peak theoretical power.
Figure 4:
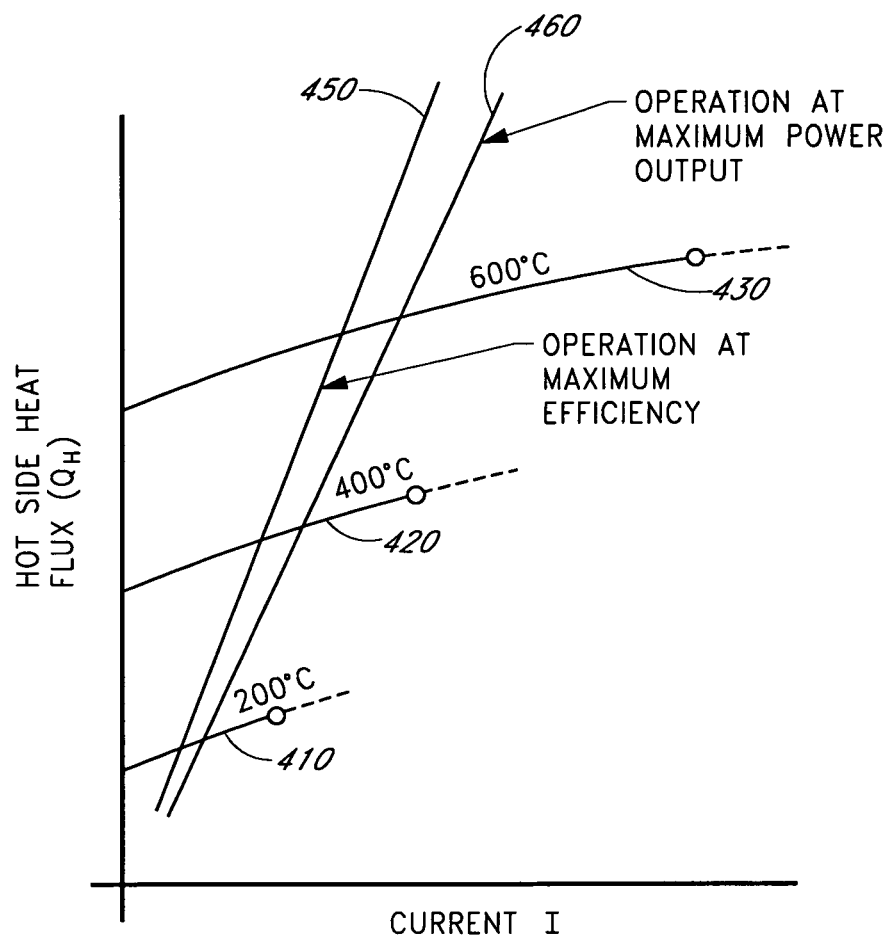
FIG. 4 is a graph illustrating heat flux at the hot side of a thermoelectric module relative to the current through the thermoelectric module, at various hot-side operating temperatures.

Some brief background on thermoelectric efficiency with reference to FIGS. 2-4 is described to facilitate understanding the invention. An exemplary power generation performance curve for a thermoelectric material with $ZT_{ave}=1$ (the temperature weighted average ZT of a TE element) is shown in FIG. 2. In FIG. 2, the voltage output V(I), of the TE element assembly is plotted as a function of the current output, I, in three lines 210, 212, 214 for three hot side temperatures $T_1$ at 200° C., $T_2$ at 400° C. and $T_3$ at 600° C. Overlaid on the graph are corresponding power output curves 220, 222, 224, which correspond to the power from the thermoelectric at the particular point in the graph calculated in conventional fashion as power output, P, where P=I*V(I).

For illustrative purposes, the cold-side temperature is assumed to be the same for all three hot side temperatures. As seen in FIG. 2, the power is a function of voltage and current. Ideally, the thermoelectric is operated at either peak efficiency 230 or peak power 240, or some trade-off between the two. If thermal flux from the heat source increases, but the temperature remains the same for the hot side of the thermoelectric (for example, the exhaust flow rate increases but the temperature does not change), then the maximum electrical power output is fixed as shown in FIG. 2. Excess available heat flux, at the same hot side temperature, cannot flow through the thermoelectric without an increase in current, I. However, as illustrated in the power curves 220, 222, 224, an increase in current for the same hot-side temperature would actually decrease the power output P. Thus, additional thermal power does not contribute to higher electrical power output, unless the hot side temperature of the thermoelectric can be increased. Similarly, if less thermal flux than that for optimum power output ($P_m$) 240 is available, peak power is not realized. This also holds true for operation substantially at optimum efficiency. For generators operating in conditions that are not steady, a thermoelectric system designed to monitor and control the factors that influence performance and can modify generator output to improve performance.

The relationship between efficiency and hot side temperature for operation at peak efficiency and peak power is illustrated in FIG. 3. A curve illustrating operation at peak efficiency 310 and a curve illustrating operation at peak power 320 are illustrated. The heat flux, $Q_h$, through the TE assembly varies with current, I, for fixed hot and cold side temperatures. As a result, peak efficiency occurs at voltages and currents that differ from those for peak power output. It should be noted that the heat flux, $Q_h$, is a function of the TE material and device properties, and has a value defined by these properties and the current, I. If conditions vary, such as by changing load current, I, the efficiency and Q, change.

An illustration of the change in $Q_h$ with current, I, is provided in FIG. 4. In this illustration three heat flux curves 410, 420, 430 are illustrated representing operation of the thermoelectric at three different hot side temperatures $T_1$ at 200° C., $T_2$ at 400° C. and $T_3$ at 600° C. Overlaid on these curves is peak operating efficiency curve 450 and a peak operating power curve 460. The dashed portion three heat flux curves 410, 420, 430, representing of the heat flux, $Q_h$, indicates operation at currents, I, sufficiently large that the voltage, (and hence power output) is negative.

The performance noted above does have the characteristic that close to the peak value of power output the performance reduction is small for moderate changes in current, I and $Q_h$, so performance is not degraded appreciably for modest changes in $Q_h$. However, several other factors which interact with the thermal power control system contribute substantially to reductions in system efficiency. These factors are discussed below and the mechanisms and designs that reduce their impact on efficiency are described and are part of the present invention.

Figure 5:
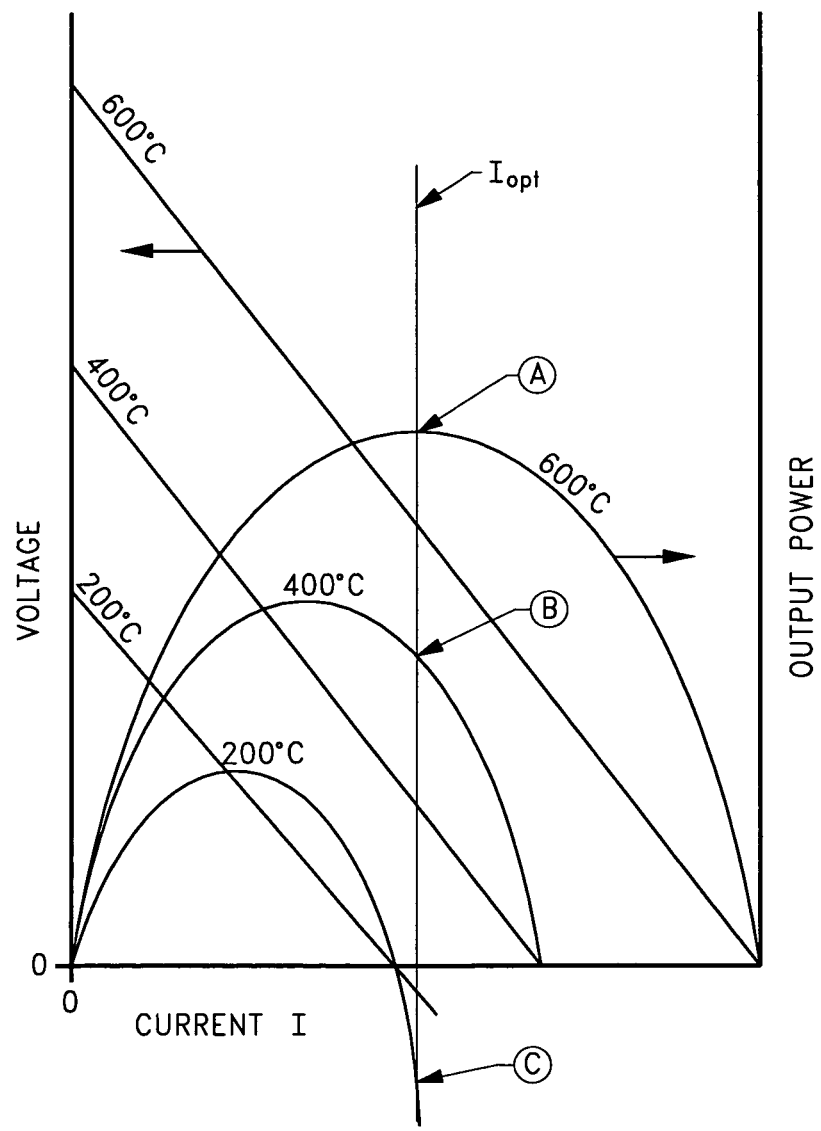
FIG. 5 is a graph illustrating voltage relative to current, with an overlay for power for a thermoelectric module.
Figure 7:
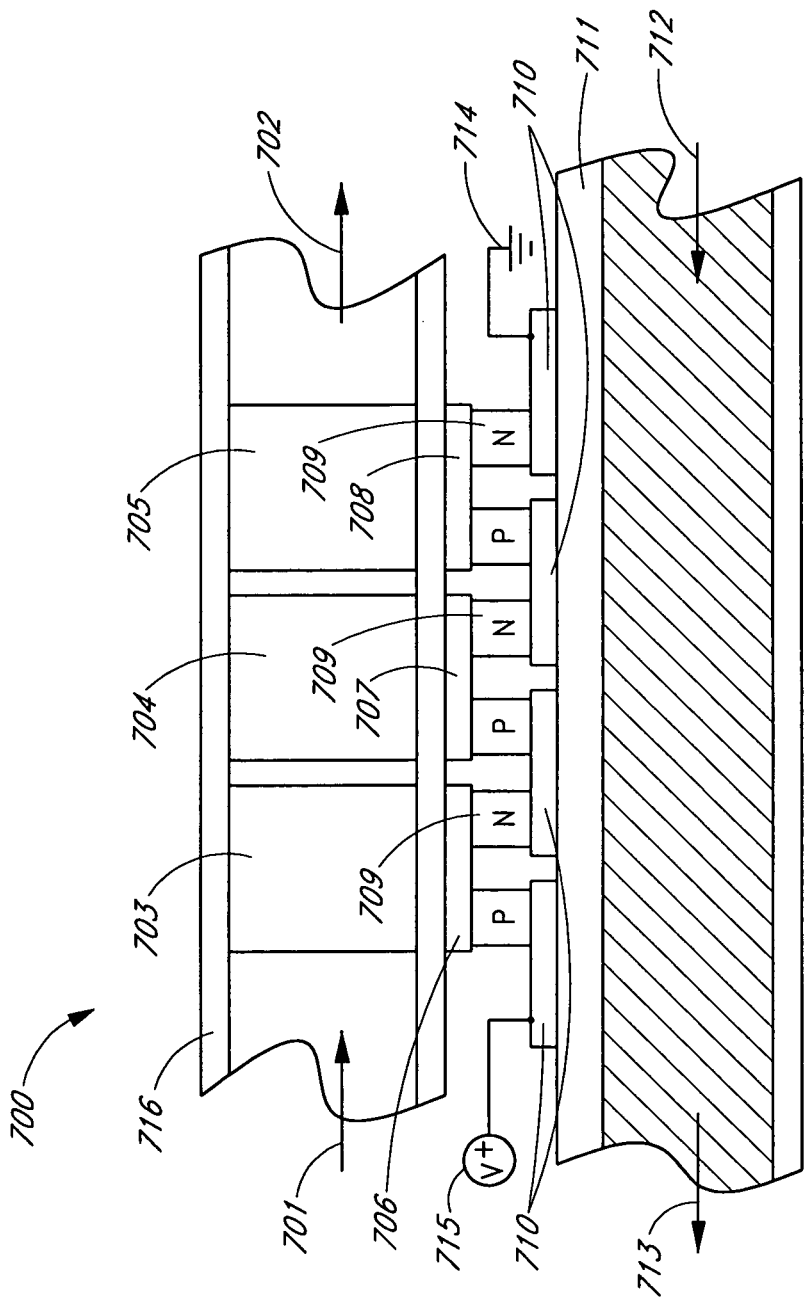
FIG. 7 depicts a portion of an exemplary thermoelectric module.

FIG. 5 is a representative plot showing the character of output voltage and power relative to current for either a single TE element (unicouple), N- and P-pair of TE elements (couple), or a group of couples. Values for a fixed cold-side temperature at different hot-side temperatures are given. Usually it is advantageous for several such elements to be connected electrically in series to form a power generation module. Often it is desirable to operate the module so that at one end, a hot working fluid enters and passes through (or by) heat exchangers in thermal contact with the hot side of the TE elements of a power generator, as shown in FIG. 7 (which will be described in detail below). As illustrated in FIG. 5, in operation, the heat transferred to the TE couples cools the working fluid, so that, for example, the fluid may enter somewhat above 600° C. so that the hot end of the first TE couple operates at 600° C., and the fluid cools so that the second couple operates at 400° C. and the third at 200° C. Thus, the hot side temperatures of the couples are progressively lower as the hot fluid cools by having given up thermal power to upstream TE couples.

If, for example, the couples are identical, the power output curves could be as shown in FIG. 5. If the couples were connected in series so that the same current, I, flowed through each, the contribution of each couple to total power output would be the sum of the powers corresponding to operating points A, B, and C. As depicted, maximum power is produced from the couple operating at 600° C., point A, but the output from the couple operating at point B (400° C.) is not optimal and the output from the couple operating at point C (200° C.) is actually slightly negative, so that it subtracts power output from the other two couples.

Figure 6:
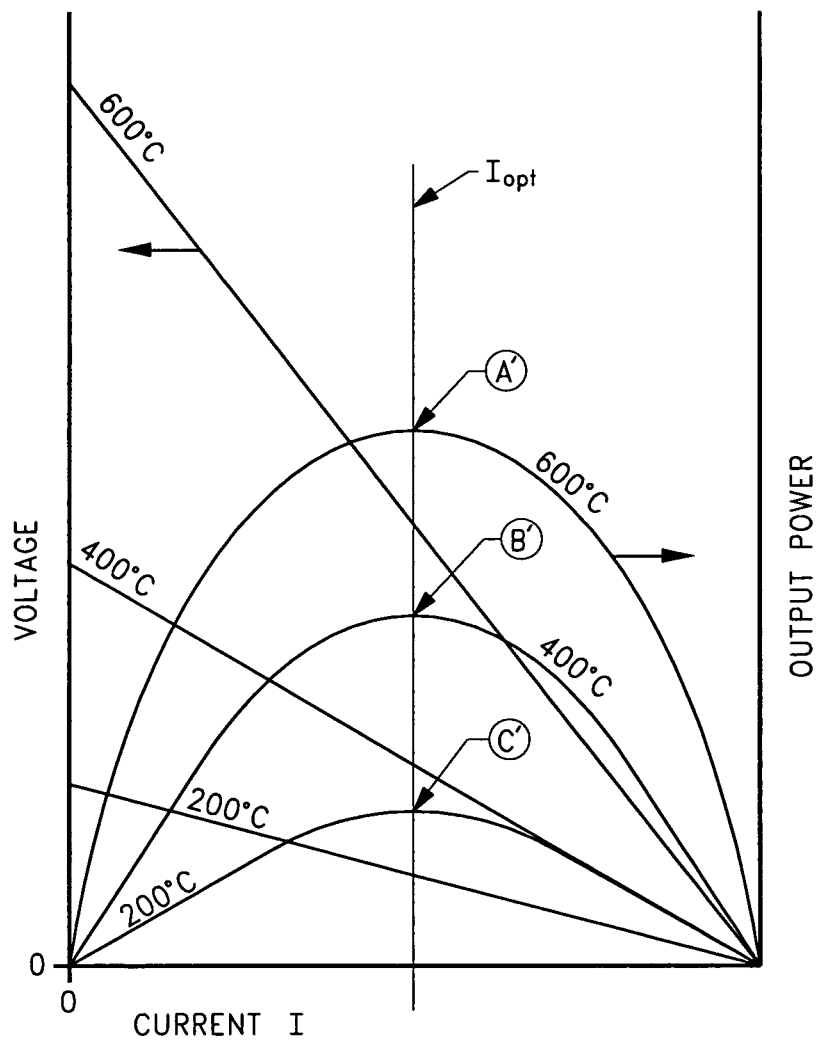
FIG. 6 is a graph illustrating voltage relative to current, with an overlay for power, for a thermoelectric power generation system operating with improved power production.

Ideally, each couple would operate at the current that produces peak power output. To achieve this, several conditions can be controlled to obtain more optimal performance from the thermoelectric generator, more consistent with the graph depicted in FIG. 6. In FIG. 6, the system is designed to permit operation at higher efficiency, even though temperature or heat flux may change. For example, the form factor (shape) of the couples is advantageously adjustable (as described in U.S. Pat. No. 6,672,076, entitled Efficiency Thermoelectrics Utilizing Convective Heat Flow and U.S. Pat. No. 6,539,725 entitled Efficiency Thermoelectric Utilizing Thermal Isolation, or in any other suitable manner) or sized so that the power produced from each couple operates at the point of peak power or peak efficiency. For example, if power output is to be maximized, the couples could be sized, as is well known to those skilled in the art [see Angrist, "Direct Energy Conversion" Third Edition, chapter four, for example], to have the characteristics shown in FIG. 6, for a TE module with couples operating at 600° C., 400° C., and 200° C. In this case, the TE couples, heat transfer characteristics and power output of the module have been maximized by operating all stages substantially at the current that substantially maximizes power output, designated A', B' and C' in FIG. 6. For operation at peak efficiency, or other operating conditions, other design criteria could be used to achieve other desired performance characteristics.

FIG. 7 is a schematic of a simple TE power generator 700. The TE power generator 700 in this illustration has three pairs of TE elements 709 electrically connected in series by hot side shunts 706, 707, 708, and cold side shunts 710. Hot fluid 701 enters hot side duct 716 and is in good thermal contact with heat exchangers 703, 704 and 705 and exits at an output port 702. The heat exchangers 703, 704 and 705 are in good thermal contact with the hot side shunts 706, 707 and 708. Cold side fluid 712 enters cold side duct 711 and exits to the left at an output port 713. The TE generator 700 has electrical connections 714 and 715 to deliver power to an external load (not shown).

In operation, hot side fluid 701 enters hot side duct 716 and transfers heat to heat exchanger 703. The hot side fluid, cooled by giving up some of its heat content to the first heat exchanger 703, then transfers an additional amount of it heat to heat exchanger 704, and then some additional heat to heat exchanger 705. The hot side fluid 701 then exits to the right at an output port 702. Heat is transferred from hot side heat exchangers 703, 704 and 705 to hot side shunts 706, 707, 708, the through TEs 709, and then through cold side shunts 710. In the process, electrical power is produced by the TEs 709 and can be extracted through electrical connections 714 and 715. Any remaining waste heat is removed by transfer through cold side shunts 710, which are in good thermal communication with the cold side duct 711, which in turn is in good thermal communication with the cold side cold side fluid 712 as it passes through the cold side duct 712 before the cold side fluid exits to the left at the cold side duct output port 713.

Figure 8:
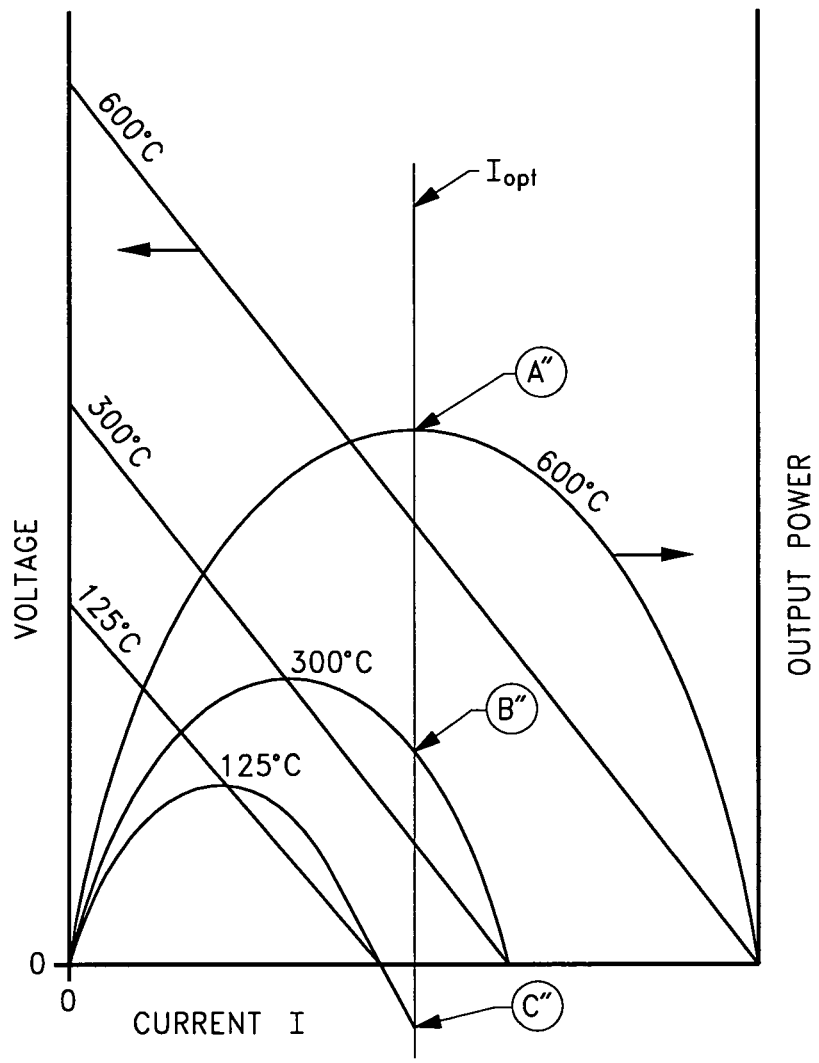
FIG. 8 is a graph illustrating yet further operation conditions depicting voltage relative to current, with an overlay for power for a thermoelectric module in accordance with FIG. 7.

The TE power generator 700 depicted in FIG. 7 for the operating characteristics shown schematically in FIG. 6, will only have peak temperatures of 600° C., 400° C., and 200° C. on the hot side under specific conditions. For example, if the working fluid conditions that achieve the performance shown in FIG. 6 are changed by decreasing the fluid mass flow, and increasing inlet temperature a corresponding appropriate amount, the first TE couple will still be at 600 C, but the temperatures of the other two couples will decrease. A condition could be produced such as that shown schematically in FIG. 8, in which the operating points A", B" and C" do not yield a TE module with optimal performance when the TE elements are connected as shown in FIG. 7. The resulting imbalance in operating currents, similar to that of FIG. 5, and described above, would reduce power output undesirably.

Figure 9:
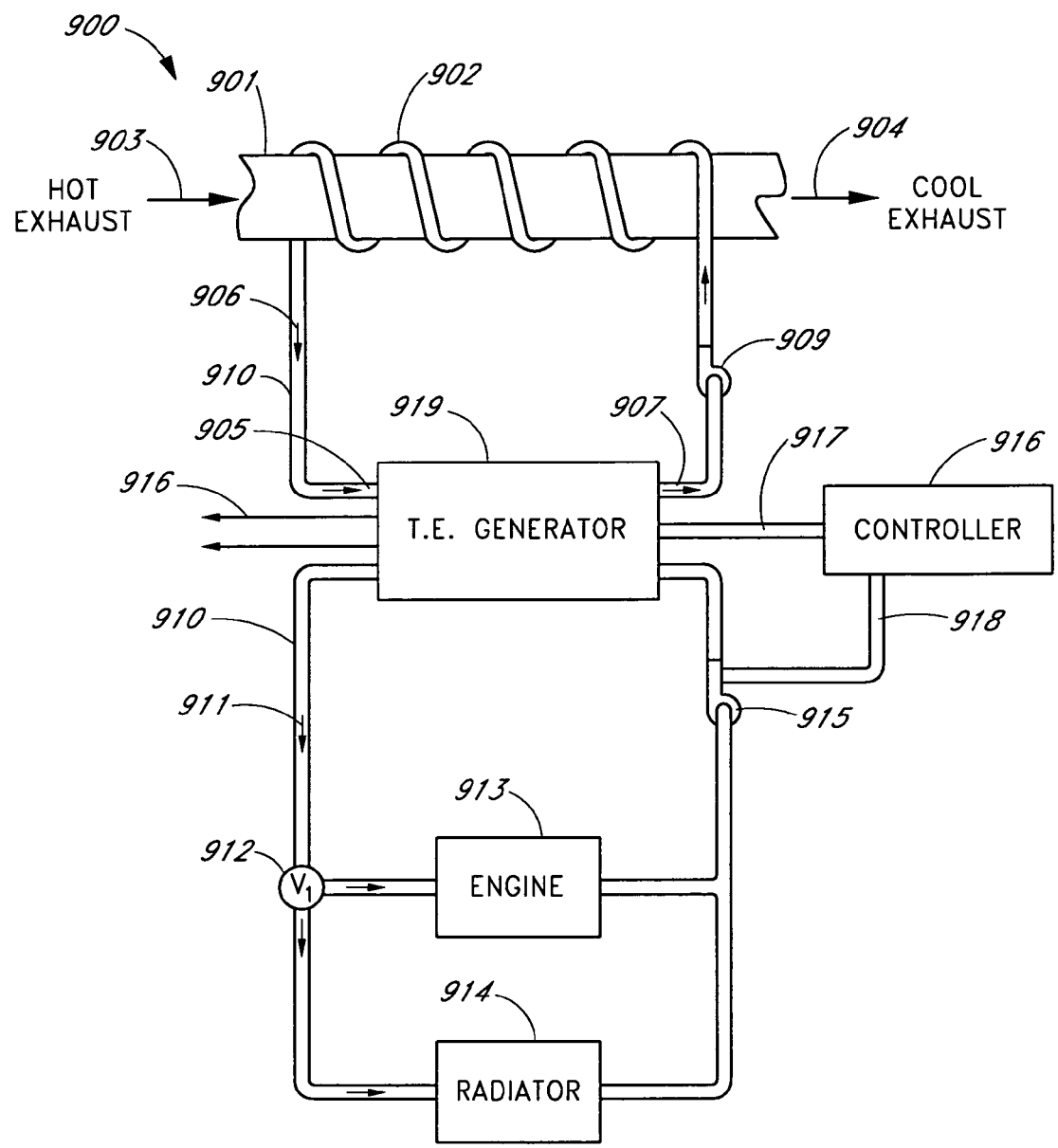
FIG. 9 depicts an exemplary embodiment of a thermoelectric power generator for use in generating power from a heat source.

An advantageous configuration of a TE power generator system 900, for example for power generation from waste heat from an engine, is depicted in schematic form in FIG. 9. The hot exhaust 903 from the engine passes through a hot side duct 901 and exits as cool exhaust 904. A hot side heat exchanger 902 is in good thermal communications with the hot side duct 901, and thereby, in thermal communication with the hot exhaust 903. In this embodiment, a pump 909 pumps hot side working fluid 906. A TE generator 919, consisting of TE modules, is in good thermal communication with the hot side working fluid 906, 905, 907. A cold side coolant 911 is contained in a coolant duct 910 and passes in good thermal contact with the TE generator 919, engine 913, and radiator, 914. A pump 915 pumps a cold-side working fluid 911 through the cold side ducts 910. A valve 912 controls flow direction of the cold-side working fluid 911. Various communication channels, power sources and signal transmitters, are designated collectively as other devices 918. A controller 916 is connected to the other devices 918, to the pump 915, and to at least one sensor, or a plurality of sensors (not shown), to the TE module 919, and to other parts of the vehicle via harnesses or buses 916, 917.

In operation, the hot exhaust 903 passing through the hot side duct 901 heats a hot side working fluid 906, which passes through the hot side working fluid conduit 902. This hot-side working fluid 906 provides heat for the hot side of the TE generator 919. The TE generator 919 is operated generally as described in the description of FIG. 7 to produce electrical power. The pump 915 pumps cold side working fluid (a coolant) 911, to remove unused (waste) heat from the TE generator 919. The waste heat absorbed in cold-side coolant 911 is directed by a valve $V_1$ 912. The valve 912 can be used to direct the cold-side coolant for the most beneficial use depending on current operating conditions. For example, the valve $V_1$ 912 may direct cold side working fluid 910 either to the engine, if it is cold, such as during startup, or to a radiator 914 to eliminate waste heat. The controller 916 utilizes sources of information (for example from sensors, some of which are presently available on automobiles), such as fuel and air mass flow rate, pressures, exhaust temperatures, engine RPM, and all other available relevant information to adjust the flow from the pumps 909, 915, and the controls within the TE generator 919 to achieve the desired output from the waste-heat recovery system 900.

For this embodiment, as well as for all embodiments of he invention, the hot side fluid (906 in this case) can be steam, NaK, HeXe mixture, pressurized air, high boiling point oil, or any other advantageous fluid. Further, the hot side fluid 906 can be a multi-phase system, as an example, nanoparticles dispersed in ethylene glycol/water mixture, a phase change multi-phase system, or any other advantageous material system. Further, by utilizing direct thermal connection, and by eliminating unneeded components, solid material systems, including heat pipes, could replace the fluid-based systems described above.

For this embodiment, and all embodiments of the invention, the cold-side loop may also employ any heat elimination mechanism, such as a finned aluminum tubular cores, evaporative cooling towers, impingement liquid coolers, heat pipes, vehicle engine coolants, water, air, or any other advantageous moving or stationary heat sinking apparatus.

The controller 916 controls the TE generator 919, hot and cold side heat exchangers, based on sensors and other inputs. The controller 916 monitors and controls the functions to, at least in part, produce, control, and adjust or modify electrical power production. Examples of a TE generator 919 are provided in more detail in the discussions of FIGS. 10 and 11. Again, such controller operation described here is not limited to this particular embodiment.

The TE controller 916 is in communication with, and/or monitors operating conditions in any or all of the following components: mechanisms for devices measuring, monitoring, producing, or controlling the hot exhaust; components within the TE generator 919; devices within the cold side loop such as valves, pumps, pressure sensors, flow, temperature sensors; and/or any other input or output device advantageous to power generation. An advantageous function of the controller is to vary the operation of the hot side and/or cold size fluid flows so as to advantageously change the electrical output of the TE generator. For example, the controller could control, change and monitor pump speed, operate valves, govern the amount of thermal energy storage or usage and vary TE generator output voltage or current, as well as perform other functions such as adjust hot exhaust production and/or any other advantageous changes to operation. As an example of control characteristics, if the system is utilized for waste heat recovery in a vehicle, and the cold side fluid is engine coolant, a 2-way valve can be controlled by the controller or any other control mechanism to advantageously direct the flow.

Gasoline engines perform more efficiently once they warm up. Cold-side loop flow warmed by removing waste heat from the TE generator 919 can speed up the heating of the engine, if properly directed. Alternatively, the heated cold-side coolant 910 could pass through a heat exchanger to heat passenger air and then return to the TE generator inlet or be directed to the engine, to help heat it. If the engine is hot, the cold-side coolant could be directed to a radiator or any other advantageous heat sink, bypassing the engine, and then returning to the TE generator inlet.

Figure 10:
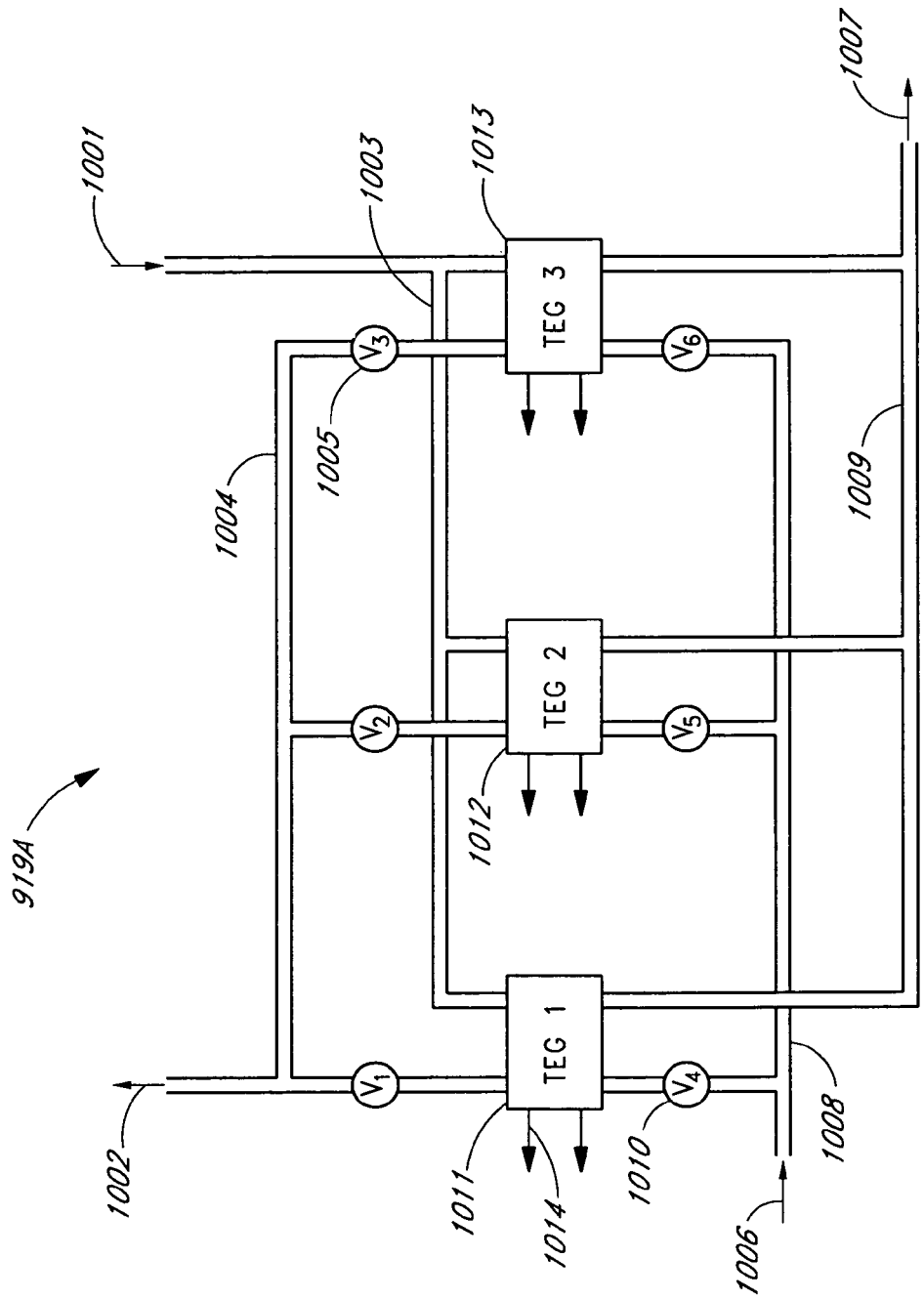
FIG. 10 depicts one embodiment for the thermoelectric generator component of the power generation system of FIG. 9.

FIG. 10 depicts one possible embodiment for a TE generator 919A as an example of the TE generator 919 of FIG. 9. The TE system 919A has three TE generators, TEG1 1011, TEG2 1012 and TEG3 1013. In this embodiment, each of the TE generators 1011, 1012, 1013 are in thermal communication with a hot-side duct 1003, 1004. The hot side ducts 1003, 1004 have hot side fluid 1001, 1002. Cold-side ducting 1008, 1009, similarly, contains a cold side working fluid 1006, 1007. Hot-side valves V1, V2 and V3 1005 control the flow of hot side fluid 1001, 1002 to the TE generators TEG1 1011, TEG2 1012, and TEG3 1013, respectively. Similarly, cold side valves V4, V5 and V6 1010 control the flow of cold side fluid flow to the TE generators TEG1 1011, TEG2 1012, and TEG3 1013, respectively. Wire harnesses 1014 transmit electrical power produced by the TE generators TEG1 1011, TEG2 1012, and TEG3 1013, to other parts of the vehicle. Sources of information and control mechanisms such as fuel and air mass flow rate, pressures, exhaust temperatures, engine RPM, and all other available relevant information to adjust the operation of TE generator 919A, and the connections to pumps, valves 1005, 1006, and all other mechanisms are not shown.

In operation, flow of the hot side fluid 1001 provides thermal power to the TE generators TEG1 1011, TEG2 1012, and TEG3 1013, can be operated by suitably functioning valves $V_1$-$V_6$ 1005, 1006. By way of example, at a low thermal power input, valves $V_1$ and $V_4$, 1005, 1006 would open to heat the hot side and cool the cold side of one TE generator TEG1 1011. The other valves $V_2$-$V_6$ would remain in a state to prevent heating of the second TE generator TEG2 1012, and the third TE generator TEG3 1013. The pump 909 (shown in FIG. 9) would be adjusted to provide flow of hot side fluid 901 that maximizes power output from the first TE generator TEG1 1011. Similarly, the pump 915 (shown in FIG. 9), would be adjusted to provide the flow of hot side fluid 1001 that maximizes power output from the first TE generator TEG1 1011. If the available thermal power increases, valves $V_2$ and $V_5$ 1005, 1006 could be actuated to engage the second TE module TEG2 1012. The pump 909 (see FIG. 9) could be adjusted by the controller 916 to maximize power output from the first TE generator TEG1 1011 and the second TE generator TEG2 1012.

Alternatively, the first TE generator TEG, 1011 could be shut off by shutting off valves $V_1$ and $V_4$ 1005, 1006 (or just Valve $V_1$) if performance were further improved by doing so. Similarly, at higher thermal powers, TEG3, 1013, could be engaged either alone or in combination with TEG1, 1011, and/or TEG2, 1012. The control, sensors, valves, and pump described in FIG. 8 adjust operation.

FIG. 10 depicts just one possible embodiment of a TE generator 919 in accordance with the present invention. Other variations are possible and are part of the present invention. The system could consist of at least 2, but any number of TE modules that can operate at least partially independent of each other. Advantageously each such TE module has a different capacity, as depicted by being different sizes in FIG. 10. By having TE modules of different capacity, and the ability to switch thermal power to activate or remove each TE module independently from operation, allows the controller 916 to adapt to substantially changing operational conditions.

Figure 11:
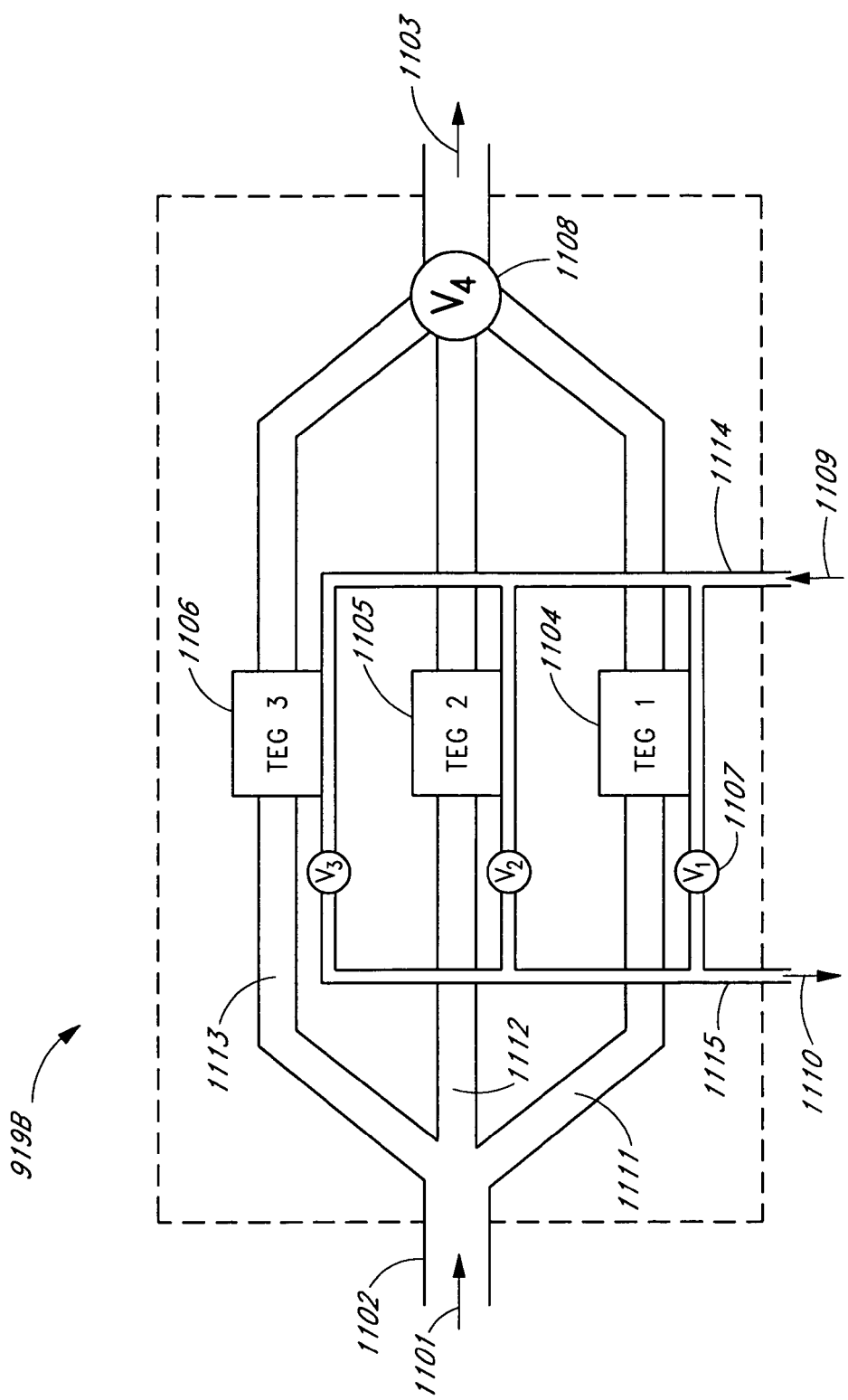
FIG. 11 depicts an alternative embodiment for the thermoelectric generator component of the power generation system of FIG. 9.

FIG. 11 depicts another alternative of a TE system 919B for the TE generator 919 (FIG. 9). Again, this TE system 919B is designed to improve output efficiency from a varying heat source such as automotive exhaust. As shown, the TE system 1100 has three TE generators TEG1 1104, TEG2 1105 and TEG3 1106, in good thermal communication with a hot side heat source 1101. In the example of an automobile, this could be exhaust or another hot fluid. The hot side heat source 1101 preferably flows through a hot side duct 1102. In this embodiment, the hot side heat duct is divided into three hot side ducts 1111, 1112, 1113, each designed to carry some portion of the heat source 1101. In FIG. 11, the hot side heat source 1101 is in thermal communication with the TE generators TEG1 1104, TEG2 1105, and TEG3 1106 through the three hot side ducts 1111, 1112 and 1113. An output valve 1108 controls hot side fluid 1103 as the output. The cold side fluid 1109, 1110 in cold side ducts 1114, 1115 cools the TE generators TEG1 1104, TEG2 1105, and TEG3 1106. The flow of the cold-side fluid 1109 is controlled by the valves V1, V2 and V3 1107.

Operation of TE system 919B follows the principles described for FIGS. 9 and 10, but the hot side working fluid 906 is omitted and thermal power is transferred without a separate hot side working fluid loop. For example, in this embodiment, the exhaust flows through the conduit 1101, and no separate working fluid is provided. In this embodiment of the invention, the TE generators TEG1 1104, TEG2 1105, and TEG3 1106 are coupled through hot side heat exchangers (not shown) in thermal communication with the hot exhaust such as by direct coupling, insertion into the exhaust stream, heat pipes or any other suitable mechanism. In FIG. 11, the three TE generators TEG1 1104, TEG2 1105, and TEG3 1106, preferably of different capacities, are depicted, as in FIG. 10. Valves $V_1$, $V_2$, and $V_3$, 1107, and other devices, pumps, sensors, and other mechanisms, not shown, control cold-side working fluid 1110 flow. In operation, the valve 1108 controls exhaust flow to the TE modules TEG1 1104, TEG2 1105, and TEG3 1106. Various TE generators TEG1 1104, TEG2 1105, and TEG3 1106, engage, dependant on input conditions the desired electrical output. Exhaust valve $V_4$ 1108 could be one or more valves.

As mentioned above, although three TE generators are shown, at least two or more in any number could be used. Each TE generator could be multiple modules operating between different hot sides and/or cold side temperatures.

Further, as part of this invention, exhaust flow could be directed through any or all of the hot side pathways to vary performance not associated with electrical production, for example, to adjust exhaust back pressure, improve combustion efficiency, adjust emissions, or any other reason. In addition, the construction of the TE modules to be devised so that in the case of waste heat recovery from a fluid stream the configuration could adjust noise or combustion characteristics to incorporate all or part of the features of mufflers, catalytic converters, particulate capture or treatment, or any other desirable integration with a device that is useful in overall system operation.

What is claimed is:

1. A thermoelectric power generation system comprising:
   a thermoelectric generator having an input adapted to receive a varying thermal power from a thermal power source, and further having an output adapted to move waste heat from the thermoelectric generator, the thermal power source comprising an engine;
   a thermal power delivery system adapted to selectively deliver the waste heat from the thermoelectric generator to at least two locations; and
   a controller in communication with the delivery system, the controller programmed to respond to information regarding at least one parameter selected from the group consisting of fuel mass flow rate and air mass flow rate by selecting at least one of the at least two locations for delivery of the waste heat by the delivery system such that the thermoelectric generator operates substantially efficiently as the thermal power received by the thermoelectric generator varies.

2. The thermoelectric power generation system of claim 1, wherein one of the at least two locations is a radiator of the engine.

3. The thermoelectric power generation system of claim 1, wherein the engine comprises a combustion engine in a vehicle adapted to carry occupants, and wherein one of the at least two locations is the occupant compartment.

4. The thermoelectric power generation system of claim 1, wherein the controller is adapted to control the removal of waste heat from a cold side of the thermoelectric generator.

5. The thermoelectric power generation system of claim 1, wherein the thermoelectric generator has at least two thermoelectrics, and wherein the controller selectively directs thermal power from the thermal power source to only one of the two thermoelectrics during certain conditions and selectively directs thermal power from the thermal power source to both of the at least two thermoelectrics during other conditions of varying thermal power.

6. The thermoelectric power generation system of claim 1, wherein the thermoelectric generator has at least three thermoelectrics, and wherein the controller selectively directs thermal power from the thermal power source to any one of the thermoelectrics.

7. The thermoelectric power generation system of claim 1, wherein the thermoelectric generator comprises at least two thermoelectrics.

8. The thermoelectric power generation system of claim 7, wherein the delivery system is controllable to selectively deliver thermal power from the thermal power source either to a first number of thermoelectrics of the at least two thermoelectrics or to a second number of thermoelectrics of the at least two thermoelectrics, the first number less than the second number.

9. The thermoelectric power generation system of claim 7, wherein the delivery system is controllable to selectively deliver thermal power from the thermal power source either to one thermoelectric of the at least two thermoelectrics or to two thermoelectrics of the at least two thermoelectrics.

10. The thermoelectric power generation system of claim 7, wherein the delivery system is controllable to selectively deliver thermal power from the thermal power source either to a first thermoelectric of the at least two thermoelectrics, a second thermoelectric of the at least two thermoelectrics, or to both the first thermoelectric and the second thermoelectric.

11. The thermoelectric power generation system of claim 7, wherein the controller is in communication with the delivery system to control the cooling conditions provided by the delivery system.

12. The thermoelectric power generation system of claim 11, further comprising a cold-side working fluid in thermal communication with the delivery system, wherein the controller is in communication with the delivery system to control the cold-side working fluid flow rate to control the operating properties of the at least two thermoelectrics.

13. The thermoelectric power generation system of claim 1, wherein the delivery system uses a hot-side working fluid, and wherein the flow rate of the hot-side working fluid is controllable via the controller.

14. The thermoelectric power generation system of claim 1, wherein the at least one parameter comprises fuel mass flow rate.

15. The thermoelectric power generation system of claim 1, wherein the at least one parameter comprises air mass flow rate.

16. The thermoelectric power generation system of claim 1, wherein the controller is further programmed to utilize information regarding a pressure of a cold-side working fluid of the thermoelectric generator to select the at least one of the at least two locations for delivery of the waste heat.

17. A thermoelectric power generation system comprising:
   a thermoelectric generator having an input adapted to receive a varying thermal power from a thermal power source, and further having an output adapted to move waste heat from the thermoelectric generator to a cold-side working fluid;

a thermal power delivery system adapted to selectively deliver thermal power to at least two locations; and a controller in communication with the delivery system, the controller programmed to utilize information regarding a pressure of the cold-side working fluid to select at least one of the at least two locations for delivery of the thermal power by the delivery system such that the thermoelectric generator operates substantially efficiently as the thermal power received by the thermoelectric generator varies.

18. The thermoelectric power generation system of claim 17, wherein the thermal power source comprises an engine, the thermal power selectively directed by the delivery system comprises the waste heat from the thermoelectric generator, and wherein one of the at least two locations is a radiator of the engine.

19. The thermoelectric power generation system of claim 17, wherein the thermal power source comprises an engine, the thermal power selectively directed by the delivery system comprises the waste heat from the thermoelectric generator, and wherein one of the at least two locations is the engine.

20. The thermoelectric power generation system of claim 17, wherein the thermal power source comprises an engine of a vehicle, the thermal power selectively directed by the delivery system comprises the waste heat from the thermoelectric generator, and wherein one of the at least two locations is an occupant compartment of the vehicle.

* * * * *

UNITED STATES PATENT AND TRADEMARK OFFICE
CERTIFICATE OF CORRECTION

PATENT NO. : 9,006,556 B2  Page 1 of 1
APPLICATION NO. : 11/476325
DATED : April 14, 2015
INVENTOR(S) : Lon E. Bell et al.

It is certified that error appears in the above-identified patent and that said Letters Patent is hereby corrected as shown below:

On the title page, (item 73) at line 1, change "Genthem" to --Gentherm--.

In column 1 (page 4, item 56) at line 71, Under Other Publications, change "Themoelectric" to --Thermoelectric--.

In column 2 (page 4, item 56) at line 2, Under Other Publications, change "Thermoelectrice" to --Thermoelectric--.

In column 2 (page 5, item 56) at line 19, Under Other Publications, change "Multicopule" to --Multicouple--.

In the specification,

In column 5 at line 3, Change "thermoionic" to --thermionic--.

In column 9 at line 4, Change "he" to --the--.

Signed and Sealed this
Ninth Day of February, 2016

Michelle K. Lee
*Director of the United States Patent and Trademark Office*